US010641794B2

(12) United States Patent
Nam et al.

(10) Patent No.: US 10,641,794 B2
(45) Date of Patent: May 5, 2020

(54) PROBE BONDING DEVICE AND PROBE BONDING METHOD USING THE SAME

(71) Applicant: DAWON NEXVIEW CO., LTD., Ansan-si, Gyeonggi-do (KR)

(72) Inventors: G Jung Nam, Seoul (KR); Kang San Lee, Incheon (KR); Dae Sub Lee, Seoul (KR); Min Su Yang, Anyang-si (KR)

(73) Assignee: DAWON NEXVIEW CO., LTD., Ansan-si, Gyeonggi-do (KR)

( * ) Notice: Subject to any disclaimer, the term of this patent is extended or adjusted under 35 U.S.C. 154(b) by 277 days.

(21) Appl. No.: 15/742,883

(22) PCT Filed: Aug. 10, 2016

(86) PCT No.: PCT/KR2016/008806
§ 371 (c)(1),
(2) Date: Jan. 8, 2018

(87) PCT Pub. No.: WO2017/026802
PCT Pub. Date: Feb. 16, 2017

(65) Prior Publication Data
US 2018/0210011 A1    Jul. 26, 2018

(30) Foreign Application Priority Data

Aug. 11, 2015    (KR) .......................... 10-2015-0112917

(51) Int. Cl.
*G01R 3/00*    (2006.01)
*G01R 1/073*    (2006.01)
(Continued)

(52) U.S. Cl.
CPC ........... *G01R 3/00* (2013.01); *G01R 1/06705* (2013.01); *G01R 1/07342* (2013.01);
(Continued)

(58) Field of Classification Search
CPC .. G01R 3/00; G01R 1/07357; G01R 1/06705; G01R 1/07342; H01L 24/03;
(Continued)

(56) References Cited

U.S. PATENT DOCUMENTS 4,968,589 A * 11/1990 Perry ..................... G01R 1/073
205/122
4,983,908 A *  1/1991 Tada .................. G01R 1/07314
324/72.5

(Continued)

FOREIGN PATENT DOCUMENTS

JP    2006-071450 A    3/2006
JP    2006-292647 A    10/2006

(Continued)

OTHER PUBLICATIONS

Translation of KR 100910217 (Year: 2009).*

(Continued)

*Primary Examiner* — Christopher P McAndrew
(74) *Attorney, Agent, or Firm* — Park, Kim & Suh, LLC (57) ABSTRACT

Disclosed is a probe bonding device and method. The probe bonding device includes, a second gripper configured to move the probe to a bonding position on the substrate, a laser unit configured to emit a laser beam, a fourth vision device configured to check whether the probe gripped by the second gripper; and a controller configured to control the second gripper and the fourth vision device, wherein the controller controls the fourth vision device to photograph one end of the probe a plurality of numbers of times while sequentially adjusting a height of at least one of the second gripper and the fourth vision device at a predetermined interval to acquire information on a height of the probe based on a (Continued)

plurality of captured images, thereby bonding the probe to an accurate position to enhance bonding quality of the probe and quality of a probe card.

17 Claims, 11 Drawing Sheets (51) Int. Cl.
| | |
|---|---|
| G01R 1/067 | (2006.01) |
| H01L 23/00 | (2006.01) |
| H01L 21/60 | (2006.01) |
| H01L 21/50 | (2006.01) |
| H01L 21/68 | (2006.01) |
| H01L 21/687 | (2006.01) |
| H01L 21/66 | (2006.01) |

(52) U.S. Cl.
CPC .......... *G01R 1/07357* (2013.01); *H01L 21/50* (2013.01); *H01L 21/681* (2013.01); *H01L 21/68707* (2013.01); *H01L 22/12* (2013.01); *H01L 24/03* (2013.01); *H01L 2021/60007* (2013.01)

(58) Field of Classification Search
CPC . H01L 22/12; H01L 21/68707; H01L 21/681; H01L 21/50; H01L 2021/60007
USPC .................................................... 324/756.03
See application file for complete search history.

(56) References Cited

U.S. PATENT DOCUMENTS

| | | | | |
|---|---|---|---|---|
| 6,110,823 A * | 8/2000 | Eldridge | ............. | B23K 20/004 257/E21.503 |
| 6,294,922 B1 * | 9/2001 | Okubo | .................... | G01R 3/00 324/755.06 |
| 6,436,802 B1 * | 8/2002 | Khoury | .............. | G01R 1/06738 257/E23.021 |
| 6,812,718 B1 * | 11/2004 | Chong | ............... | G01R 1/07342 324/754.07 |
| 7,102,367 B2 * | 9/2006 | Yamagishi | ........ | G01R 1/07378 324/754.07 |
| 7,243,410 B2 * | 7/2007 | Wada | ................. | G01R 1/07342 174/250 |
| 7,285,967 B2 * | 10/2007 | Kim | ................... | G01R 1/07342 324/754.07 |
| 7,319,341 B1 * | 1/2008 | Harms | ............... | G01R 1/06794 324/754.28 |
| 7,805,832 B2 * | 10/2010 | Burke | ............... | H01L 21/67144 29/729 |
| 8,066,470 B2 * | 11/2011 | Zin | ................... | H01L 21/67333 414/800 |
| 8,333,860 B1 * | 12/2012 | Bibl | ........................ | H01L 24/83 156/249 |
| 8,415,771 B1 * | 4/2013 | Golda | .................... | H01L 24/75 257/621 |
| 8,587,333 B2 * | 11/2013 | Sato | ................... | G01R 1/06716 324/500 |
| 2001/0015650 A1 * | 8/2001 | Takemoto | .......... | G01R 1/06761 324/756.03 |
| 2003/0001606 A1 * | 1/2003 | Bende | ................ | G01R 1/06738 324/750.16 |
| 2003/0016036 A1 * | 1/2003 | Ahn | .................... | G01R 31/2831 324/755.07 |
| 2003/0146769 A1 * | 8/2003 | McQuade | ................ | G01R 3/00 324/756.03 |
| 2003/0184330 A1 * | 10/2003 | Arisaka | .............. | G01R 1/07342 324/756.03 |
| 2004/0090223 A1 * | 5/2004 | Yonezawa | .......... | G01R 31/2889 324/756.03 |
| 2004/0113644 A1 * | 6/2004 | Wood | ....................... | G01R 3/00 324/756.03 |
| 2004/0124519 A1 * | 7/2004 | Zhou | ................... | G01R 1/07378 257/686 |
| 2004/0179343 A1 * | 9/2004 | Karavakis | ............. | G01R 1/0483 361/771 |
| 2007/0103177 A1 * | 5/2007 | Chen | ................... | G01R 1/06727 324/755.07 |
| 2010/0047954 A1 * | 2/2010 | Su | .......................... | B26F 3/002 438/61 |
| 2010/0109697 A1 * | 5/2010 | Oh | ..................... | G01R 1/06733 324/756.03 |
| 2010/0148809 A1 * | 6/2010 | Kim | .................. | G01R 1/07314 324/756.03 |
| 2011/0169517 A1 * | 7/2011 | Kim | ................... | G01R 1/06744 324/756.03 |
| 2011/0175637 A1 * | 7/2011 | Nakatani | ............ | G01R 1/07342 324/756.03 |
| 2011/0281380 A1 * | 11/2011 | Narizuka | ........... | G01R 1/07314 438/17 |
| 2012/0007627 A1 * | 1/2012 | Chen | .................. | G01R 31/2889 324/756.03 |
| 2013/0162278 A1 * | 6/2013 | Chung | ................. | B23K 1/0008 324/755.01 |
| 2013/0162280 A1 * | 6/2013 | Chung | ................. | B23K 1/0008 324/756.03 |
| 2015/0054541 A1 * | 2/2015 | Lee | .................... | G01R 1/07378 324/756.03 |
| 2015/0276811 A1 * | 10/2015 | Yamada | ............. | G01R 31/2891 324/756.03 |
| 2017/0074926 A1 * | 3/2017 | Edwards | ........... | G01R 1/07314 |

FOREIGN PATENT DOCUMENTS

| | | |
|---|---|---|
| KR | 20-0176166 Y1 | 3/2000 |
| KR | 10-0910217 B1 | 7/2009 |
| KR | 10-1180350 B1 | 9/2012 |

OTHER PUBLICATIONS

Translation of JP 2006292647 (Year: 2006).*
Translation of JP 2006071450 (Year: 2006).*
Translation of KR 101180350 (Year: 2012).*
International Search Report in International Application No. PCT/KR2016/008806, dated Nov. 22, 2016.

* cited by examiner

PROBE BONDING DEVICE AND PROBE BONDING METHOD USING THE SAME

CROSS-REFERENCE TO RELATED APPLICATIONS

This application is a National Phase Application of PCT International Application No. PCT/KR2016/008806, which was filed on Aug. 10, 2016, and which claims priority from Korean Patent Application No. 10-2015-0112917 filed with the Korean Intellectual Property Office on Aug. 11, 2015. The disclosures of the above patent applications are incorporated herein by reference in their entirety.

TECHNICAL FIELD

The present invention relates to a probe bonding device and a probe bonding method using the same, and more particularly, a probe bonding device for accurately controlling a bonding position of a probe and a probe bonding method using the same.

BACKGROUND ART

A probe device is used to test the electrical properties of a chip formed on a wafer.

Figure 1:
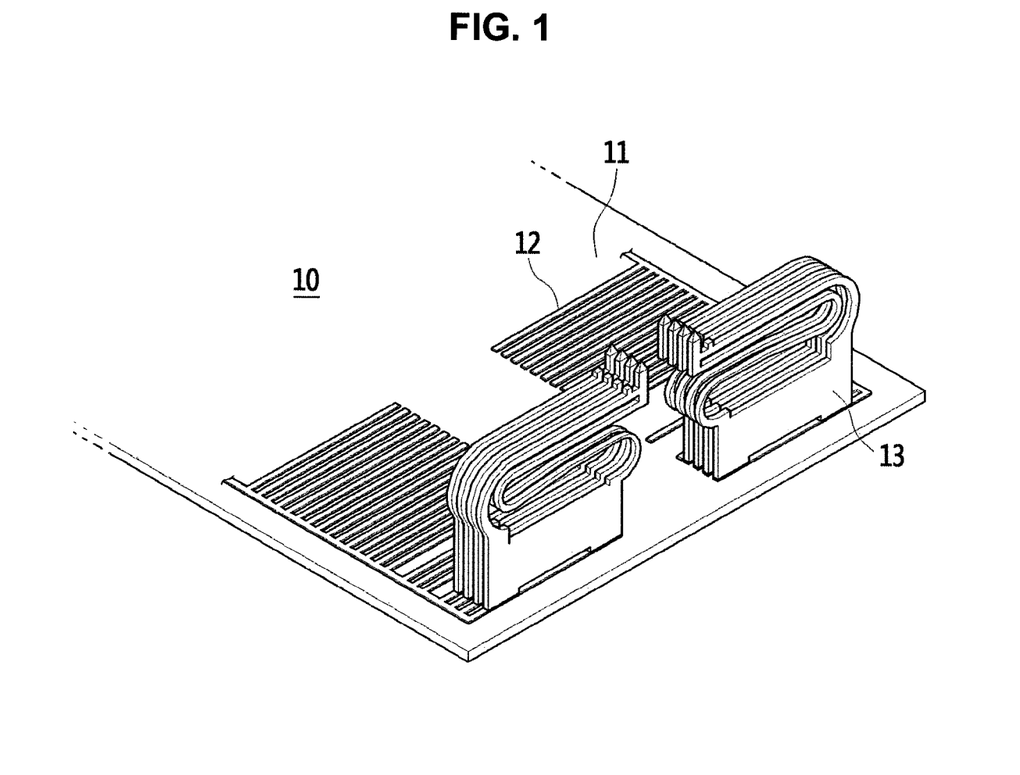
FIG. 1 is a reference diagram showing a probe card.

FIG. 1 is a diagram showing a general probe card 10. Referring to FIG. 1, the probe card 10 includes a substrate (ceramic, glass, wafer, or the like) 11, an electrode 12 formed on the substrate, and a plurality of probes 13 bonded to the electrode.

A chip on a wafer fabricated via semiconductor fabrication receives an electrical signal through pads formed on the chip to perform a predetermined operation and, then, re-transmits a processing result to a wafer test system through the pads and, in this case, a probe card is used to determine whether the chip is appropriately operated.

Figure 2:
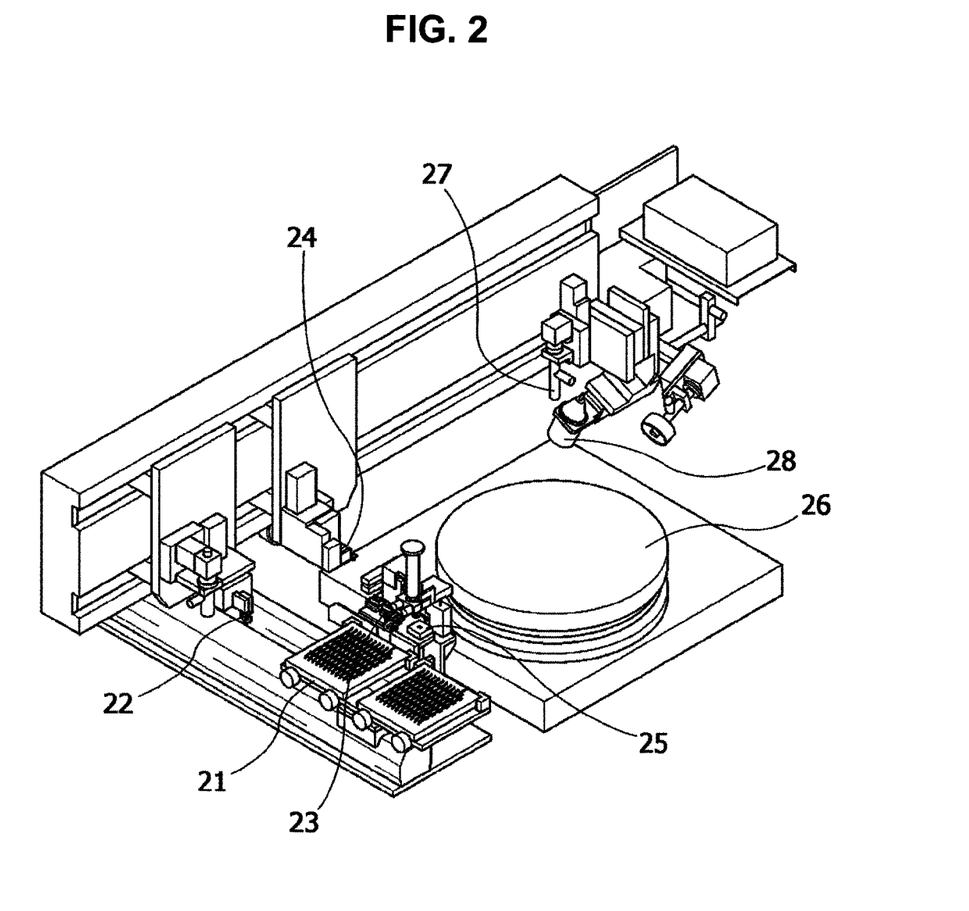
FIG. 2 is a schematic perspective view of a conventional probe bonding device.

FIG. 2 is a diagram showing a conventional probe bonding device 20.

Referring to FIG. 2, the conventional probe bonding device 20 includes a tray 21, a first gripper 22, a forming unit 23, a second gripper 24, a solder bath 25, a chuck unit 26, a vision device 27, and a laser unit 28.

The conventional probe bonding device 20 is configured in such a way that a probe installed on the tray 21 is gripped by the first gripper 22, is moved to the forming unit 23 and, then, is mechanically aligned using the forming unit 23. Then, the probe is gripped by the second gripper 24 and is dipped into the solder bath 25 to coat a lower portion of the probe with a solder paste. Then, the second gripper 24 moves the probe with the solder paste coated thereon to a bonding position of a substrate fixed onto the chuck unit 26 and the laser unit 28 irradiates a laser beam to the probe to complete bonding. To enhance the quality of a probe card, the precision of a bonding position of a probe is very important and, to this end, the conventional probe bonding device 20 adjusts the probe to be bonded to a precise bonding position using the vision device 27.

A camera included in the vision device 27 performs photographing vertically downward and toward the substrate fixed onto the chuck unit 26 from above the chuck unit 26 and, in this regard, there is no problem in terms of control of horizontal coordinates (x and y coordinates) of a bonding position of the probe but there is a problem in that it is not possible to accurately measure a height (z coordinates) to the probe from the bonding position.

In general, the probe is positioned above the horizontal coordinates of the bonding position using the second gripper 24 and, then, is lowered to contact the bonding position. In this case, when a height to the probe from the bonding position is not accurate, even if the probe contacts the bonding position, the probe is forcibly lowered or even if the probe does not contact the bonding position, a laser irradiation process is terminated and, accordingly, problems arise in that a minute error arises in a position of the probe or the bonding quality of the probe is degraded.

DISCLOSURE

Technical Problem

An object of the present invention devised to solve the problem lies in a bonding device and a probe bonding method, for accurately extracting height information of a probe using a plurality of images that are captured while sequentially changing a height of a vision device and correcting a corresponding difference between a predetermined height and the height of the probe are different.

Technical Solution

The object of the present invention can be achieved by providing a probe bonding device including at least one tray with a plurality of probes accommodated thereon, a first gripper configured to grip a probe accommodated on the tray, a forming unit configured to receive the probe from the first gripper and to mechanically align the probe, a dipping unit including a solder bath with a solder paste accommodated therein, a chuck unit configured to fix a substrate to which the probe is bonded, a second gripper configured to grip the probe aligned by the forming unit, to dip the probe into the solder bath to coat a lower portion of the probe with the solder paste, and to move the probe to a bonding position on the substrate, a laser unit configured to emit a laser beam to solder the probe to an electrode of the substrate, a first vision device configured to map a position of the probe accommodated on the tray, a fourth vision device configured to check whether the probe gripped by the second gripper and moved above the substrate is positioned at a home position to which the probe is to be bonded, and a controller configured to control the second gripper and the fourth vision device, wherein the controller controls the fourth vision device to photograph one end of the probe a plurality of numbers of times while sequentially adjusting a height of at least one of the second gripper and the fourth vision device at a predetermined interval to acquire information on a height of the probe based on a plurality of captured images.

The controller may control the fourth vision device to photograph the one end of the probe a plurality of numbers of times while sequentially adjusting the height of the fourth vision device at a predetermined interval to acquire information on the height of the probe based on a height of the fourth vision device, at which a clearest image is captured among the plurality of captured images.

The controller may control the fourth vision device to photograph an electrode disposed on the substrate a plurality of numbers of times while sequentially adjusting the height of the fourth vision device at a predetermined interval to acquire information on a height of the electrode disposed on the substrate based on the height of the fourth vision device, at which the clearest image is captured among the plurality of captured images, and to calculate a measurement height as a height to the probe from the electrode disposed on the substrate.

A standard height to the probe from the electrode disposed on the substrate may be pre-input to the controller, and the controller may compare the standard height and the measurement height.

When the standard height and the measurement height are different, the controller may adjust a height of the second gripper to correct a difference.

When the probe gripped by the second gripper is positioned above a bonding position of the substrate, the controller may lower the second gripper to the bonding position of the substrate and lower the second gripper to a point to maintain a predetermined interval between a lower end of the probe and the substrate without contact between the lower end and the substrate.

When the laser unit emits a laser beam and a solder paste coated on the probe begins to be melted, the controller may re-lower the second gripper to contact the electrode of the substrate.

The probe bonding device may further include a second vision device configured to check an alignment state of the probe by the forming unit, and a third vision device configured to monitor dipping of the probe into the solder bath.

The probe bonding device may further include a fifth vision device configured to monitor a soldering procedure by the laser unit.

The fifth vision device may be a coaxial camera configured to perform photographing in a direction parallel to a laser beam emitted from the laser beam.

In another aspect of the present invention, provided herein is a probe bonding method including accommodating a plurality of probes on at least one tray, performing first movement of gripping the probe by a first gripper and moving the probe to a forming unit, mechanically aligning the probe by the forming unit, coating a lower portion of the probe with a solder paste by gripping the probe by the second gripper and dipping the probe into a solder bath with the solder paste accommodated therein, performing second movement of moving the probe gripped by the second gripper above an electrode of a substrate, performing probe height check of photograph one end of the probe moved above the electrode of the substrate a plurality of numbers of times while adjusting a height of the fourth vision device or the second gripper at a predetermined interval to calculate a height of the probe, lowering the probe toward the electrode of the substrate, and soldering the probe to the electrode of the substrate by emitting a laser beam.

The performing of the probe height check may include inputting a standard height to the probe from the electrode of the substrate, photographing one end of the probe a plurality of number of times while sequentially adjusting a height of the fourth vision device, calculating probe height information based on a height of the fourth vision device, at which a clearest image is captured among a plurality of images captured in the photographing of the one end of the probe, photographing the electrode of the substrate while sequentially adjusting the height of the fourth vision device, calculating electrode height information based on the height of the fourth vision device, at which the clearest image is captured among a plurality of images captured in the photographing of the electrode, calculating a measurement height to the probe from the electrode of the substrate through the probe height information and the electrode height information, and comparing the standard height and the measurement height.

The performing of the probe height check may further include correcting a height of the second gripper by as much as a corresponding difference when the standard height and the measurement height are different.

The lowering of the probe may include lowering the probe to a point to maintain a predetermined interval between a lower end of the probe and the substrate without contact between the lower end and the substrate.

The probe bonding method may further include performing second lowering of re-lowering the probe to allow the lower end of the probe to contact the electrode of the substrate when the solder paste is melted.

A grip pressure of the second gripper in the dipping of the probe and a grip pressure in the performing of the second movement and the lowering of the probe may be different.

The grip pressure of the second gripper in the dipping of the probe may be greater than a grip pressure in the lowering of the probe.

The probe bonding method may further include checking whether the probe is soldered to a home position by photographing the one end of the probe soldered to the electrode of the substrate by the fourth vision device.

Advantageous Effects

A bonding device and a probe bonding method according to the present invention may accurately extract height information of a probe using a plurality of images that are captured while sequentially changing a height of a vision device and may correct a corresponding difference between a predetermined height and the height of the probe are different.

DESCRIPTION OF DRAWINGS

FIGS. 7($a$) to 7($d$) are reference diagrams for explanation of a method of mechanically aligning a probe.

FIGS. 10($a$) and 10($b$) are reference diagrams for explanation of a method of correcting a height of a probe using a fourth vision device.

BEST MODEL

The present invention will now be described more fully with reference to the accompanying drawings, in which exemplary embodiments of the present invention are shown. The present invention may, however, be embodied in many different forms and should not be construed as being limited to the embodiments set forth herein; rather, these embodiments are provided so that this disclosure will be thorough and complete, and will fully convey the concept of the present invention to those of ordinary skill in the art.

In the drawings, components with the same function are denoted by the same reference number within the scope of the present invention.

Figure 3:
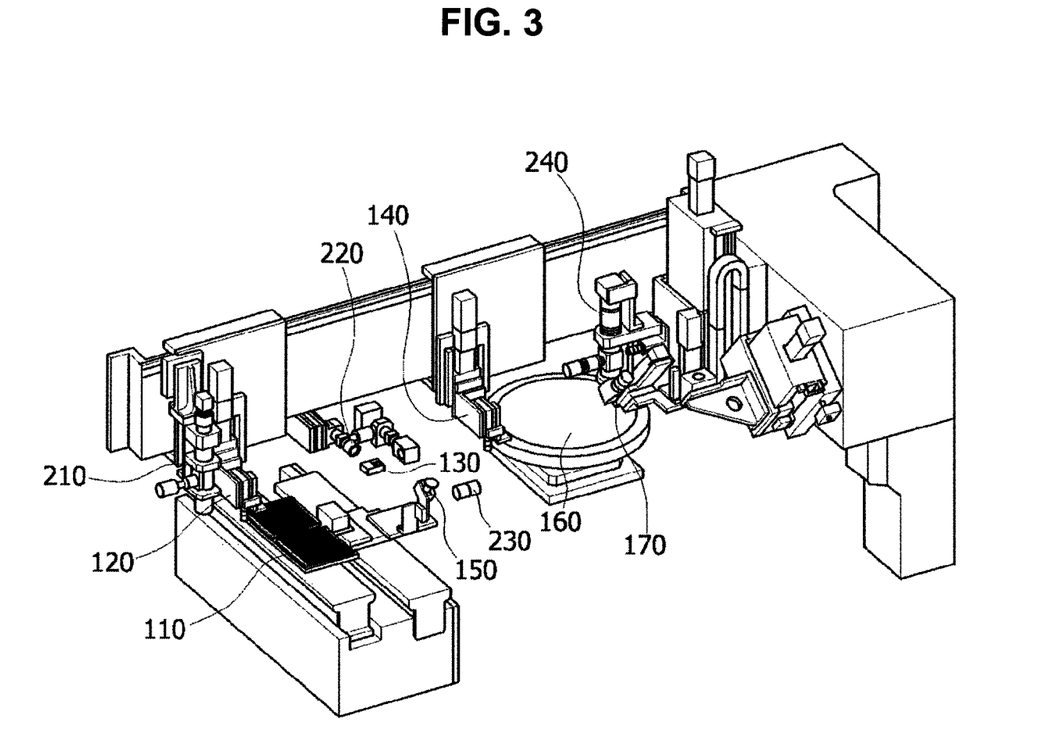
FIG. 3 is a schematic perspective view of a probe bonding device 100 according to an embodiment of the present invention.
Figure 4:
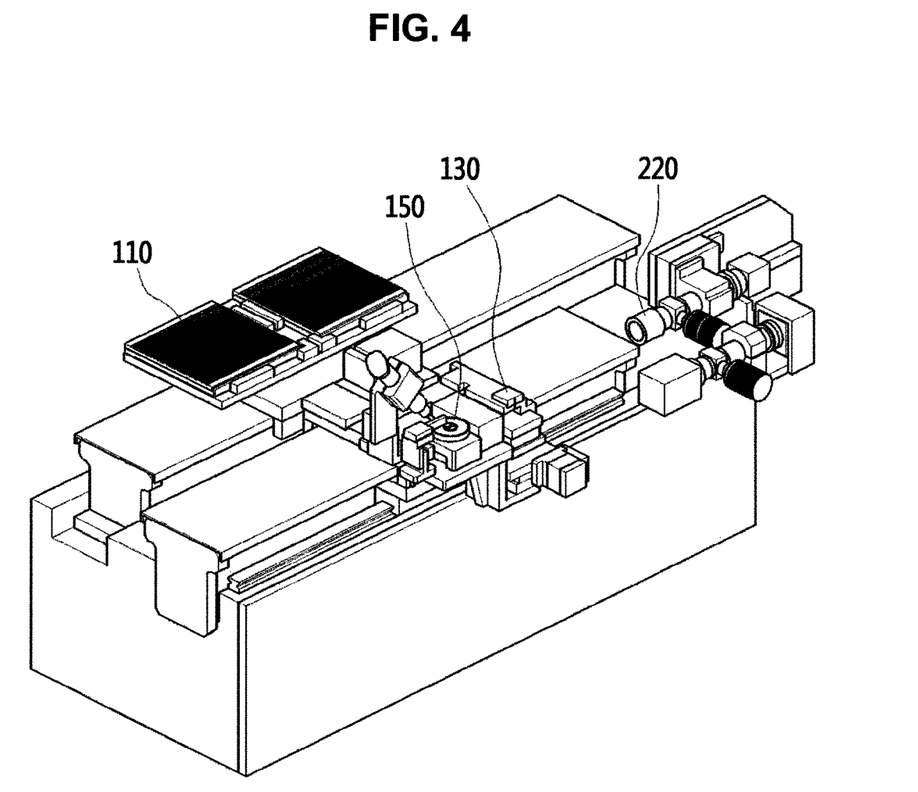
FIGS. 4 and 5 are enlarged perspective views of a portion of the probe bonding device according to an embodiment of the present invention.
Figure 5:
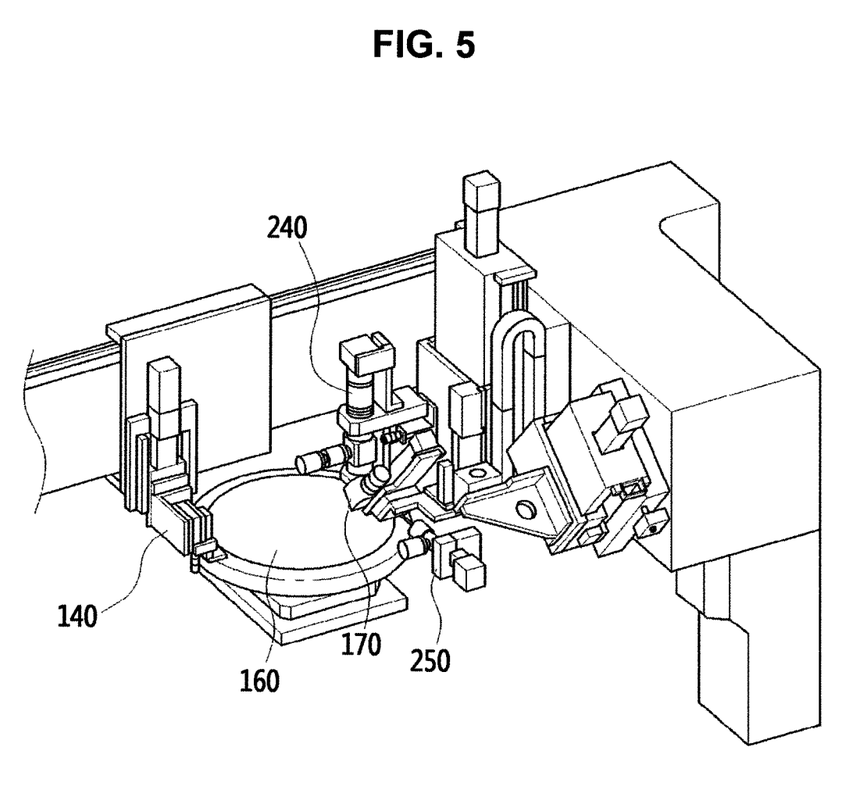

FIG. 3 is a perspective view of a probe bonding device 100 according to an embodiment of the present invention. FIGS. 4 and 5 are enlarged perspective views of a portion of the probe bonding device 100 according to an embodiment of the present invention.

To clearly described embodiments of the present invention, directions are now defined. In the drawing, x, y, and z refer to a longitudinal direction, a width direction, and a height direction, respectively. Here, the longitudinal direction and the width direction are parallel to a horizontal plane and the height direction is perpendicular to a horizontal plane.

Referring to FIGS. 3 to 5, the probe bonding device 100 according to an embodiment of the present invention may include at least one tray 110 with a plurality of probes 13 accommodated thereon, a first gripper 120 for gripping the probe 13, a forming unit 130 for mechanically aligning the probe 13, a second gripper 140 for gripping the probe 13, a dipping unit 150 including a solder bath 151a with a solder paste accommodated therein, a chuck unit 160 for fixing a substrate, a laser unit 170 for emitting a laser beam to bond the probe 13, a first vision device 210 for mapping a position of the probe 13 accommodated on the tray 110, a second vision device 220 for checking an alignment state of the probe 13 by the forming unit 130, a third vision device 130 for monitoring dipping of the probe 13 into the solder bath 151a, a fourth vision device 240 for checking whether the probe 13 gripped by the second gripper 140 and moved above the substrate is positioned in a home position at which the probe 13 is to be bonded, a fifth vision device 250 for monitoring bonding by the laser unit 170, and a controller (not shown).

Figure 6:
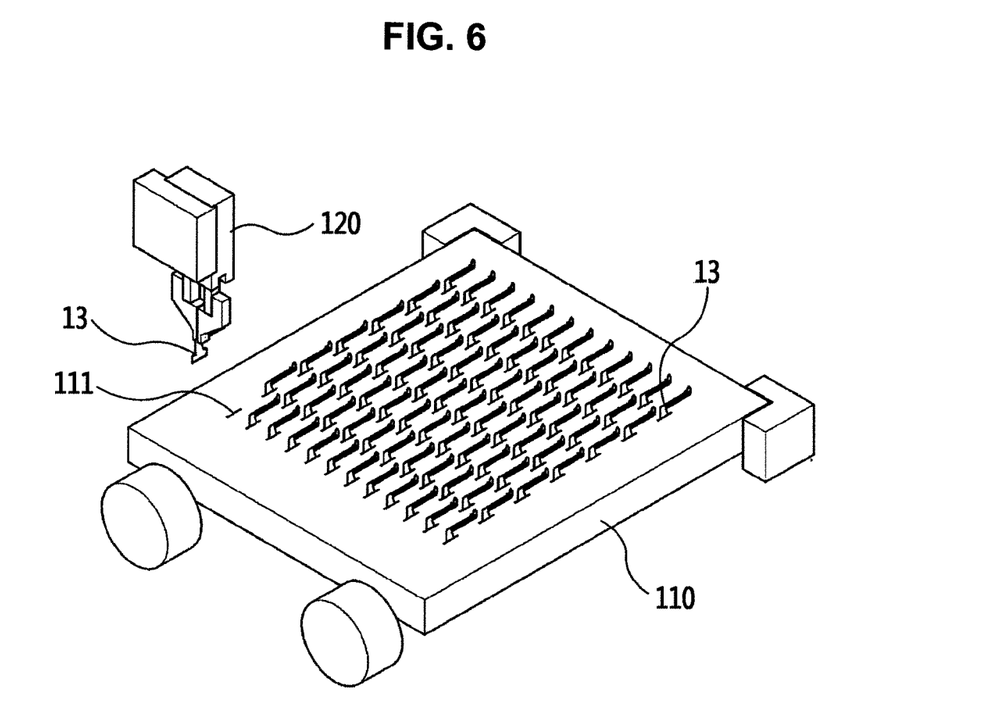
FIG. 6 is a reference diagram showing a tray with a probe accommodated thereon.
Figure 7:
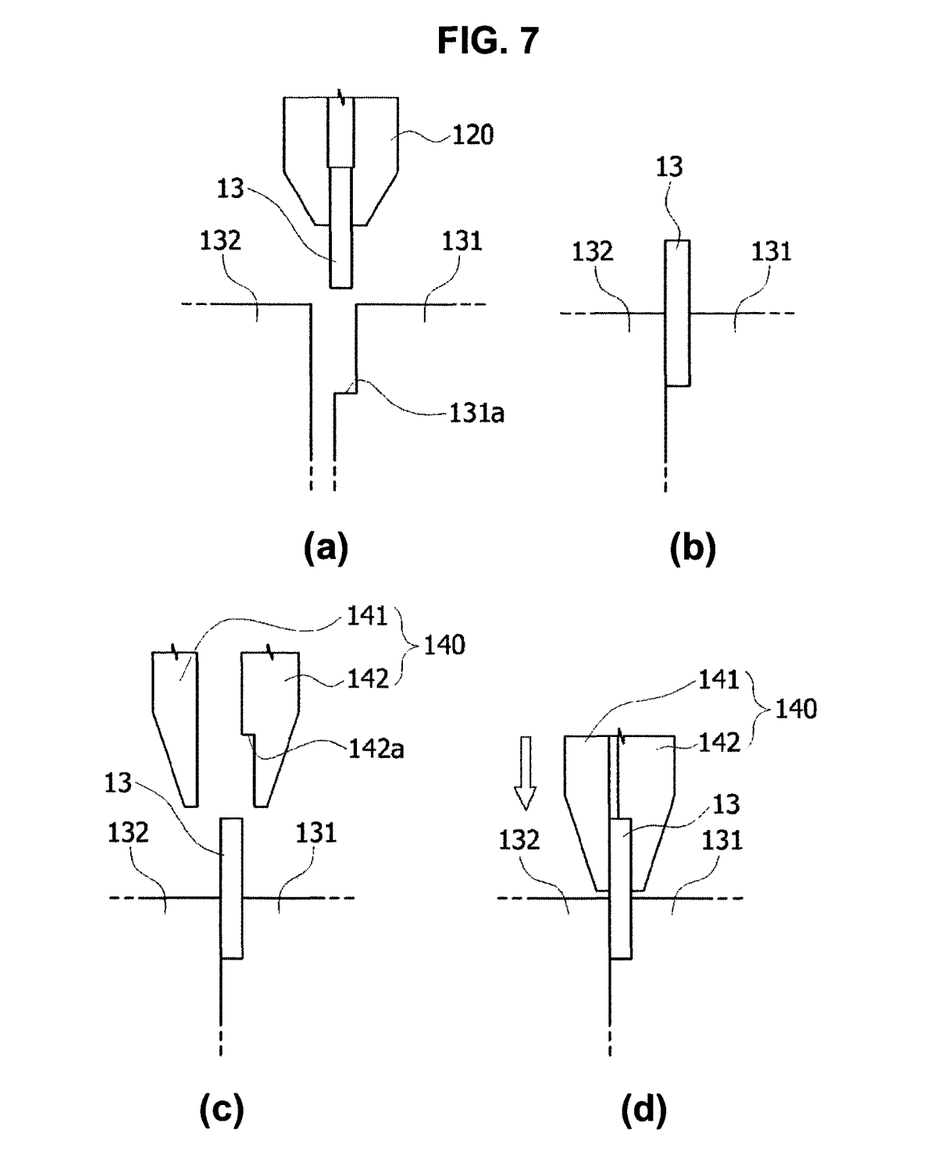

The tray 110 may be configured to accommodate the plurality of probes 13 thereon. FIG. 6 is a reference diagram showing the tray 110 with the probe 13 accommodated thereon. Referring to FIG. 6, the tray 110 may include insertion grooves 111 that are formed at an equal interval to allow a lower portion of the probe 13 to be perpendicularly inserted. The tray 110 may be moved in a width direction and a longitudinal direction, that is, along an x axis and a y axis.

In this case, the first vision device 210 may map a position at which the probe 13 is accommodated and the first gripper 120 to be described later may be moved to the position of the probe 13, mapped by the first vision device 210, to grip the probe 13.

The first gripper 120 may grip the probe 13 to move the probe 13 to the forming unit 130 to be described later. In this case, the first gripper 120 may grip the probe 13 at opposite lateral surfaces.

The forming unit 130 may receive the probe 13 moved by the first gripper 120 and may mechanically align the probe 13. FIGS. 7(a) to 7(d) are reference diagrams for explanation of a method of mechanically aligning the probe 13. Referring to FIGS. 7(a) to 7(d), the forming unit 130 may include a pair of jigs 131 and 132 that receive the probe 13 from the first gripper 120 and grip the probe 13. Any one 131 of the pair of jigs 131 and 132 may include a jig end portion 131a that the lower portion of the probe 13 contacts.

The second gripper 140 may include a pair of jaws 141 and 142 and any one 142 of the pair of jaws 141 and 142 may include a jaw end portion 142a that an upper end of the probe 13 contacts.

Referring to FIGS. 7(a) to 7(d), the second gripper 140 may grip the probe 13 gripped by the forming unit 130. In this case, the second gripper 140 may be lowered along a z axis while gripping the probe 13 at minimum pressure, the upper end of the probe 13 may contact a jaw end portion 142a, and the lower portion of the probe 13 may contact the jig end portion 131a. Thereby, the probe 13 may be mechanically aligned.

In this case, the second vision device 220 may monitor whether the probe 13 is mechanically aligned by the forming unit 130 and the second gripper 140.

Figure 8:
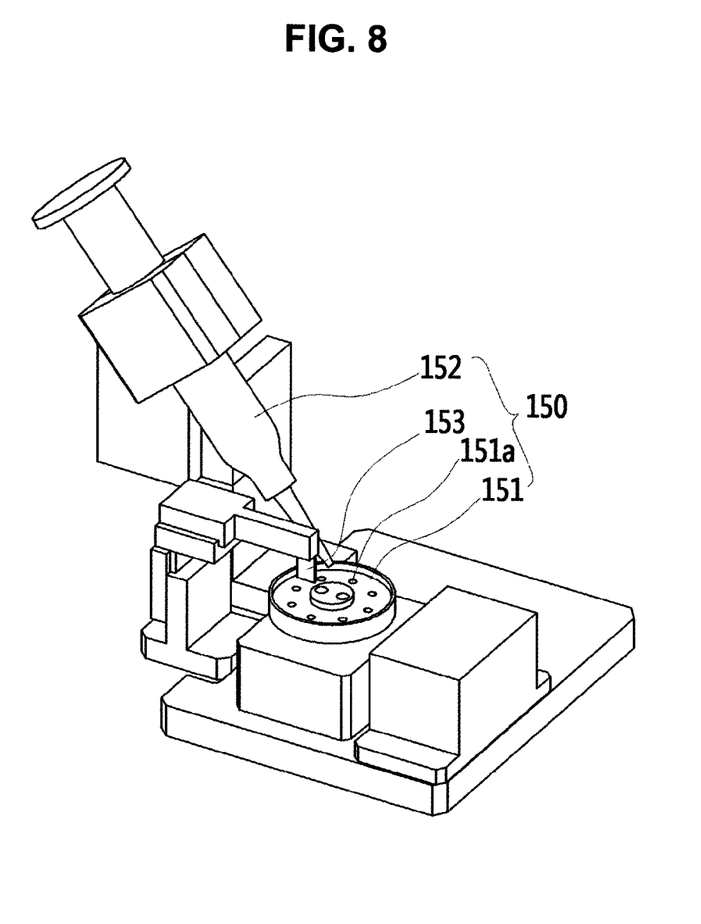
FIG. 8 is a schematic perspective view of a dipping unit.

FIG. 8 is a schematic perspective view of the dipping unit 150. Referring to FIG. 8, the dipping unit 150 may include a solder bath unit 151 including at least one solder bath 151a and moved on a plane with x and y axes, a syringe 152 positioned above the solder bath unit 151 to supply a solder paste to the solder bath 151a, and a squeegee 153 positioned above the solder bath unit 151 to smoothen an upper surface of the solder paste supplied to the solder bath 151a via movement of the solder bath unit 151.

In this case, the solder bath unit 151 may rotate around an axis parallel to a z axis as a rotation axis and a plurality of solder baths 151a may be formed at an equal interval in a circumferential direction in which the solder bath unit 151 rotates. The solder bath unit 151 may periodically repeat an operation of rotating the solder bath unit 151 by as much as the interval at which the plurality of the solder baths 151a is formed and stopping rotation.

In more detail, when the syringe 152 supplies a solder paste to any one of the plurality of solder baths 151a, the solder bath unit 151 may rotate to move another solder bath 151a adjacent to the solder bath 151a with the solder paste supplied thereto to a position for receiving a solder paste from the syringe 152. In this case, the solder bath 151a with the solder paste supplied thereto passes below the squeegee 153 while the solder bath unit 151 rotates and, thus, the upper surface of the solder paste supplied to the solder bath 151a may be smoothened.

Figure 9:
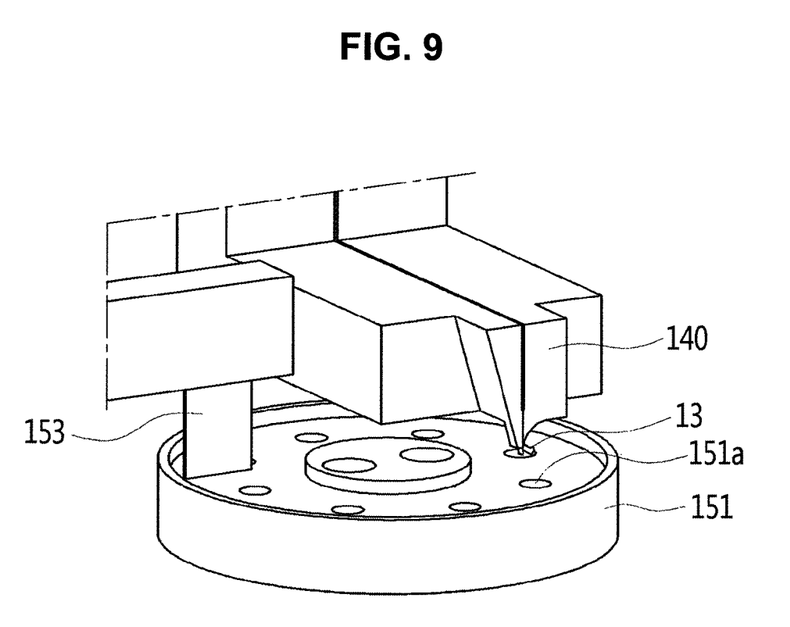
FIG. 9 is a reference diagram for explanation of dipping of a probe into a solder bath by a second gripper.

FIG. 9 is a reference diagram for explanation of dipping of the probe 13 into the solder bath 151a by the second gripper 140. Referring to FIG. 9, after the upper surface of the solder paste accommodated in the solder bath 151a is smoothened via rotation of the solder bath unit 151, the second gripper 140 may grip the probe 13 and dip the probe 13 into the solder bath 151a to coat the lower portion of the probe 13 with a solder paste. In this case, the second gripper 140 may reciprocate in a longitudinal direction (x-axis direction) and/or a width direction (y-axis direction) to uniformly coat the probe 13 with a solder paste while the probe 13 is dipped into the solder bath 151a. In this case, the second gripper 140 may strengthen a grip pressure compared with other procedures, thereby preventing alignment of the probe 13 gripped by the second gripper 140 from being lost during a dipping procedure.

In this case, the third vision device 230 may monitor whether a solder paste is appropriately coated on the probe 13 gripped by the second gripper 140.

The chuck unit 160 may fix a substrate with an upper surface to which the probe 13 is to be bonded. The chuck unit 160 may include a pre-heater for pre-heating the substrate and may be moveable and rotatable in x, y, and z-axis directions.

The fourth vision device 240 may be moved in a longitudinal direction (x-axis direction), a width direction (y-axis direction), and a height direction (z-axis direction).

The fourth vision device 240 may recognize positional information for moving the probe 13 to a bonding position on the substrate. In other words, the fourth vision device 240 may measure x, y, and z coordinates of the probe 13 gripped by the second gripper 140 and allow the probe 13 to be moved to the bonding position.

A controller (not shown) may control the fourth vision device 240 to photograph one end of the probe 13 a plurality of numbers of times while sequentially adjusting a height of at least one of the second gripper 140 and the fourth vision device 240 at a predetermined interval to acquire information on a height of the probe 13 from an upper surface of the substrate based on a plurality of captured images.

Figure 10:
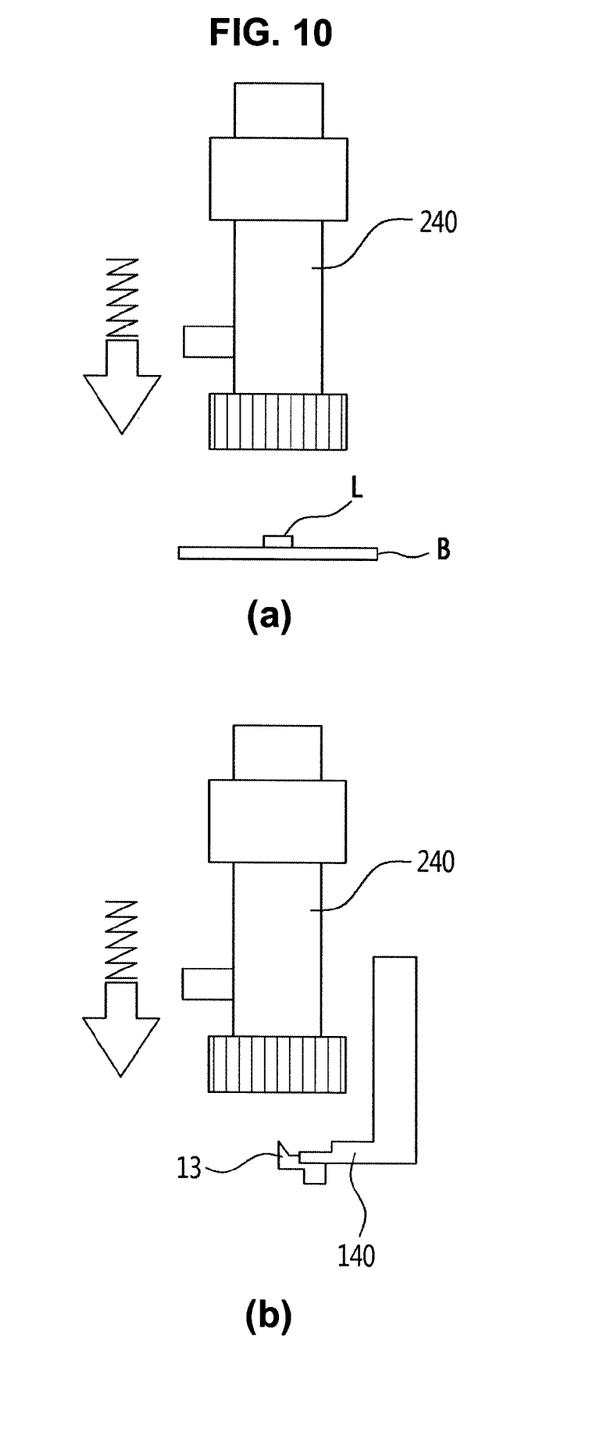

FIGS. 10(*a*) and 10(*b*) are reference diaqrams for explanation of a method of correcting a height of the probe 13 using the fourth vision device 240. Referring to FIG. 10(*a*), the fourth vision device 240 may perform photographing a plurality of numbers of times while adjusting a height of the fourth vision device 240 above and below a standard height at a predetermined interval. In this case, the predetermined interval may be 1 μm. In other words, the fourth vision device 240 may photograph one end of the probe 13 a plurality of numbers of times while adjusting the height of the fourth vision device 240 at an interval of 1 μm. In this case, a clearest image may be extracted from the plurality of captured images and height information of the probe 13 may be acquired using a height of the fourth vision device 240, at which the clearest image is captured.

Referring to FIG. 10(*b*), the fourth vision device 240 may photograph an electrode L disposed on a substrate B while adjusting a height of the fourth vision device 240 at a predetermined interval to acquire information on a height of the electrode L disposed on the substrate B using a height of the fourth vision device 240, at which a clearest image among a plurality of captured images is captured.

Here, the controller may a calculate a measurement height as a height to the probe 13 from the electrode L disposed on the substrate B through height information of the probe 13 and height information of the electrode L.

A standard height to the probe 13 from the electrode L disposed on the substrate B may be input to the controller. In other words, the standard height may be a height to the probe 13 from the electrode L disposed on the substrate B when mechanical alignment of the substrate B and the probe 13 is accurate.

Accordingly, the standard height pre-input to the controller and the measurement height may be compared and, when the standard height and the measurement height correspond to each other, it may be seen that alignment of the probe 13 in a height direction is appropriately achieved. When the standard height and the measurement height do not correspond to each other, the controller may correct the height of the second gripper 140 by as much as a difference between the standard height and the measurement height to correct the height of the probe 13.

Thereby, the probe 13 may be accurately positioned at a bounding position on the substrate.

When the probe 13 gripped by the second gripper 140 is positioned at the bonding position on the substrate, the laser unit 170 may emit a laser beam to melt a solder paste coated on a lower portion of the probe 13 and to bond the probe 13 to the substrate.

In this case, before the laser unit 170 emits a laser beam, the second gripper 140 may maintain a predetermined interval from the probe 13 without contact between the probe 13 and the substrate. Then, in a procedure in which a laser beam is emitted by the laser unit 170 and the solder paste is melted, the second gripper 140 may lower the probe 13 to contact the substrate.

Thereby, the solder paste coated on the lower portion of the probe 13 may previously come in contact with the substrate compared with the lower portion of the probe 13 to prevent alignment of the probe 13 being lost.

The laser unit 170 may emit a laser beam toward a lateral surface of the probe 13 at a predetermined angle with respect to a horizontal plane formed by x and y axes.

Here, the fifth vision device 250 may monitor a procedure in which the laser unit 170 emits a laser beam to bond the probe 13 to the substrate. In addition, the fifth vision device 250 may be a coaxial camera for performing photographing in a direction parallel to a laser beam emitted by the laser unit 170 and, thereby, whether the probe 13 is bonded at an accurate position may be obviously checked.

Figure 11:
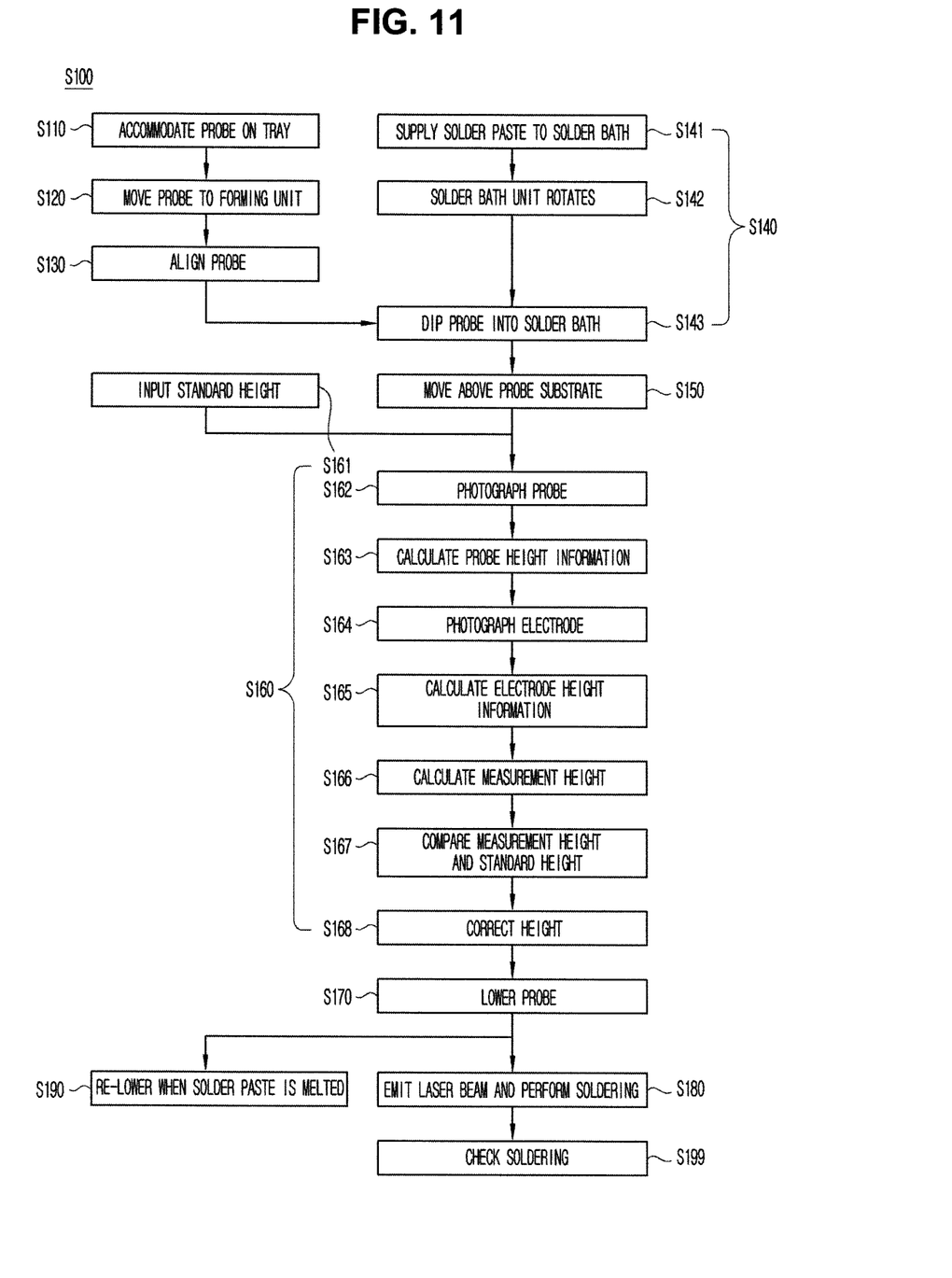
FIG. 11 is a flowchart of a probe bonding method according to an embodiment of the present invention.

FIG. 11 is a flowchart of a probe bonding method S100 according to an embodiment of the present invention. Referring to FIG. 11, the probe bonding method S100 according to an embodiment of the present invention may include a probe accommodation operation S110, a first movement operation S120, an alignment operation S130, a solder paste coating operation S140, a second movement operation S150, a probe height check operation S160, a probe lowering operation S170, a soldering operation S180, a second lowering operation S190, and a soldering check operation S199.

The probe accommodation operation S110 may be an operation of accommodating the plurality of probes 13 on the at least one tray 110. Here, positions of the plurality of probes 13 accommodated on the tray 110 may be mapped by the first vision device 210.

The first movement operation S120 may be an operation of gripping the probe 13 by the first gripper 120 and moving the probe 13 to the forming unit 130. In this case, the first gripper 120 may recognize a position of the probe 13 according to mapping information by the first vision device 210 and grip the probe 13.

The alignment operation S130 may be an operation of mechanically aligning the probe 13 by the forming unit 130. In this case, the forming unit 130 may receive the probe 13 from the first gripper 120 and grip the lower portion of the probe 13 using the pair of jig 131 and 132 and, here, the jig end portion 131*a* is formed on at least one jig 131. Then, the second gripper 140 may grip an upper portion of the probe 13 using the pair of jaws 141 and 142 and, here, the jaw end portion 142*a* is formed on at least one jaw 142. Then, the second gripper 140 may be lowered in a z-axis direction to allow the upper end of the probe 13 to contact the jaw end portion 142*a* and to allow the lower portion of the probe 13 to contact the jig end portion 131*a*, thereby mechanically aligning the probe 13.

The solder paste coating operation S140 may be an operation of gripping the probe 13 and dipping a solder paste into the solder bath 151*a* by the second gripper 140 to coat the lower portion of the probe with the solder paste.

In this case, the solder paste coating operation S140 may include a solder paste supply operation S141 of supplying a solder paste to the solder bath 151*a* formed on the solder bath unit 151 above which the syringe 152 is rotatable around a rotation axis parallel to a z axis, a solder bath unit rotation operation S142 of moving the solder bath unit 151 on a plane including an x axis and a y axis to smoothen an upper surface of the solder paste accommodated in the solder bath 151*a* by the squeegee 153, and a dipping operation S143 of dipping the lower portion of the probe 13 into the solder bath 151a to cote the lower portion of the probe 13 with a solder paste.

Here, the solder bath unit rotation operation S142 may be an operation of rotating the solder bath unit around a rotation axis parallel to a z axis.

In more detail, when the syringe 152 supplies a solder paste to any one of the plurality of solder baths 151a that is formed on an upper surface of the solder bath unit 151 at an equal interval in a circumferential direction, the solder bath unit 151 may rotate to smoothen the upper surface of the solder paste via the squeegee 153 positioned above the solder bath unit 151 and, then, the probe 13 may be dipped into a solder paste to uniformly coat the probe 13 with the solder paste, thereby effectively and uniformly coating the probe 13 with a solder paste via the plurality of solder baths 151a.

In the dipping operation S143, while the lower portion of the probe 13 is dipped into the solder paste accommodated in the solder bath 151a, the probe 13 may reciprocate on a plane including an x axis and a y axis. In other words, the probe 13 may be shaken while being dipped into the solder paste. Thereby, the solder paste may be uniformly coated on the lower portion of the probe 13.

The second movement operation S150 may be an operation of moving the probe 13 gripped by the second gripper 140 toward above an electrode of a substrate. In this case, the probe 13 may be moved to appropriate coordinates on x and y axes by the fourth vision device 240.

The probe height check operation S160 may be an operation of photographing one end of the probe 13 moved above the electrode of the substrate a plurality of numbers of times while adjusting a height of the fourth vision device 240 or the second gripper 140 to calculate a height of the probe 13. The probe height check operation S160 may include a standard height input operation S161 of inputting a standard height to the probe 13 from the electrode L of the substrate B, a probe photograph operation S162 of photographing one end of the probe 13 a plurality of number of times while sequentially adjusting a height of the fourth vision device 240, a probe height information calculation operation S163 of calculating probe height information based on a height of the fourth vision device 240, at which the clearest image is captured among the plurality of captured images in the probe photograph operation S162, an electrode photograph operation S164 of photographing the electrode L of the substrate B while sequentially adjusting the height of the fourth vision device 240, an electrode height information calculation operation S165 of calculating electrode height information based on a height of the fourth vision device 240, at which the clearest image is captured among the plurality of captured images in the electrode photograph operation S164, a measurement height calculation operation S166 of calculating a measurement height to the probe from the electrode L of the substrate B through the probe height information and the electrode height information, a height comparison operation S167 of comparing the standard height and the measurement height, and a height correction operation S166 of adjusting a height of the second gripper 140 by as much as a corresponding difference when the standard height and the measurement height are different.

In other words, the standard height as a height to the probe 13 from the electrode L of the substrate B when alignment of the probe 13 is accurate may be previously input. Accordingly, the fourth vision device 240 may photograph one end of the probe 13 a plurality of numbers of times while sequentially changing a height at a predetermined interval (e.g., 1 µm) and calculate the height of the fourth vision device 240, at which the clearest image is captured among the captured images. Thereby, the height information of the probe 13 may be calculated.

The fourth vision device 240 may photograph the electrode L on the substrate B a plurality of numbers of times while sequentially adjusting a height at a predetermined interval (e.g., 1 µm) and calculate the height of the fourth vision device 240, at which the clearest image is captured among the captured images. Thereby, the height information of the electrode L on the substrate B may be calculated.

In addition, the measurement height to the probe 13 from the electrode L on the substrate B may be calculated using the height information of the probe 13 and the height information of the electrode L on the substrate B.

Then, the measurement height may be compared with the standard height and, when the measurement height and the standard height are different, there is an error in z-axis coordinates of the probe 13 and, accordingly, the height of the second gripper 140 may be adjusted and corrected by as much as the corresponding difference.

The probe lowering operation S170 may be an operation of lowering the probe 13 toward the electrode of the substrate. In the probe lowering operation S170, the probe may be lowered to a point to maintain a predetermined interval and, thus, a lower end of the probe does not contact the electrode of the substrate.

The soldering operation S180 may be an operation of emitting a laser beam to solder the probe to the electrode of the substrate.

The second lowering operation S190 may be an operation of re-lowering the probe 13 to allow the lower end of the probe 13 to contact the electrode of the substrate when the solder paste is melted. Thereby, a solder paste coated on the lower portion of the probe 13 may previously come in contact with the substrate compared with the lower portion of the probe 13 to prevent alignment of the probe 13 being lost.

The soldering check operation S199 may be an operation of photographing one end of the probe 13 soldered to the electrode L of the substrate B to check whether the probe 13 is soldered to a home position by the fourth vision device 240.

That is, the fourth vision device 240 may photograph one end of the probe 13 to calculate x, y, and z coordinates of the probe 13. Here, one end of the probe 13 may be photographed a plurality of numbers of times while sequentially changing the height of the fourth vision device 240 at a predetermined interval to calculate z coordinates of the probe 13 based on a height of the fourth vision device 240, at which the clearest image is captured among the plurality of captured images.

In this case, upon determining that an error arises in a position of the probe 13, the controller may apply predetermine indication to the probe 13 in which the error arises and, when an error continuously arises, soldering may not be performed any longer on the corresponding substrate.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A probe bonding device comprising:
   at least one tray with a plurality of probes accommodated thereon;
   a first gripper configured to grip a probe accommodated on the at least one tray;
   a forming unit configured to receive the probe from the first gripper and to mechanically align the probe;
   a dipping unit comprising a solder bath with a solder paste accommodated therein;
   a chuck unit configured to fix a substrate to which the probe is bonded;
   a second gripper configured to grip the probe aligned by the forming unit, to dip the probe into the solder bath to coat a lower portion of the probe with the solder paste, and to move the probe to a bonding position on an electrode of the substrate;
   a laser unit configured to emit a laser beam to solder the probe to the electrode of the substrate;
   a first vision device configured to map a position of the probe accommodated on the at least one tray;
   a fourth vision device configured to check whether the probe gripped by the second gripper and moved above the substrate is positioned at the bonding position to which the probe is to be bonded; and
   a controller configured to control the second gripper and the fourth vision device,
   wherein the controller is configured to:
      receive a standard height to the probe from the electrode of the substrate;
      control the fourth vision device to photograph an end of the probe which is moved above the bonding position to be bonded thereto a plurality of number of times while sequentially adjusting a height of the fourth vision device;
      calculate probe height information based on a height of the fourth vision device, at which a clearest image is captured among a plurality of images of the end of the probe;
      control the fourth vision device to photograph the electrode of the substrate a plurality of number of times while sequentially adjusting the height of the fourth vision device;
      calculate electrode height information based on a height of the fourth vision device, at which the clearest image is captured among a plurality of images of the electrode;
      calculate a measurement height to the probe from the electrode of the substrate using the probe height information and the electrode height information; and
      compare the standard height to the measurement height to determine a difference therebetween.

2. The probe bonding device according to claim 1, wherein, when the standard height and the measurement height are different, the controller adjusts a height of the second gripper to correct the difference between the standard height and the measurement height.

3. The probe bonding device according to claim 1, wherein, when the probe gripped by the second gripper is positioned above the bonding position on the substrate, the controller is configured to lower the probe toward the electrode of the substrate using the second gripper to form a predetermined interval between a lower end of the probe and the electrode of the substrate without contact between the lower end of the probe and the electrode of the substrate.

4. The probe bonding device according to claim 3, wherein, when the laser unit emits the laser beam and the solder paste coated on the lower portion of the probe begins to be melted, the controller is configured to further lower the probe toward the electrode of the substrate using the second gripper to allow the lower end of the probe to contact the electrode of the substrate.

5. The probe bonding device according to claim 1, further comprising:
   a second vision device configured to check an alignment state of the probe by the forming unit; and
   a third vision device configured to monitor a dipping of the probe into the solder bath.

6. The probe bonding device according to claim 1, further comprising a fifth vision device configured to monitor a soldering procedure of the probe by the laser unit.

7. The probe bonding device according to claim 6, wherein the fifth vision device is a coaxial camera configured to perform photographing in a direction parallel to the laser beam emitted from the laser unit.

8. A probe bonding method comprising:
   accommodating a plurality of probes on at least one tray;
   moving a probe on the at least one tray to a forming unit using a first gripper;
   mechanically aligning the probe by the forming unit;
   coating a lower portion of the probe with a solder paste by gripping the probe using a second gripper and dipping the probe into a solder bath accommodating the solder paste therein;
   moving the probe gripped by the second gripper above an electrode of a substrate;
   determining a height of the probe by photographing an end of the probe moved above the electrode of the substrate a plurality of numbers of times while adjusting a height of the fourth vision device at a predetermined interval;
   lowering the probe toward the electrode of the substrate based on the determined the height of the probe; and
   soldering the probe to the electrode of the substrate by emitting a laser beam,
   wherein the determining the height of the probe comprises:
      inputting a standard height to the probe from the electrode of the substrate;
      photographing the end of the probe a plurality of number of times while sequentially adjusting the height of the fourth vision device;
      calculating probe height information based on a height of the fourth vision device, at which a clearest image is captured among a plurality of images captured in the photographing of the end of the probe;
      photographing the electrode of the substrate a plurality of number of times while sequentially adjusting the height of the fourth vision device;
      calculating electrode height information based on a height of the fourth vision device, at which the clearest image is captured among a plurality of images captured in the photographing of the electrode;
      calculating a measurement height to the probe from the electrode of the substrate through the probe height information and the electrode height information; and
      comparing the standard height to the measurement height to determine a difference therebetween.

9. The probe bonding method according to claim 8, wherein the determining the height of the probe further comprises adjusting a height of the second gripper to correct the difference between the standard height and the measurement height, when the standard height and the measurement height are different.

10. The probe bonding method according to claim 8, wherein the lowering of the probe comprises lowering the probe toward the electrode of the substrate to form a predetermined interval between a lower end of the probe and the electrode of the substrate without contact between the lower end of the probe and the electrode of the substrate.

11. The probe bonding method according to claim 10, further comprising further lowering the probe toward the electrode of the substrate to allow the lower end of the probe to contact the electrode of the substrate after the solder paste coated on the lower portion of the probe is melted.

12. The probe bonding method according to claim 8, wherein a grip pressure of the second gripper in the dipping of the probe and a grip pressure of the second gripper in the moving of the probe above the electrode of the substrate and the lowering of the probe are different.

13. The probe bonding method according to claim 12, wherein the grip pressure of the second gripper in the dipping of the probe is greater than the grip pressure of the second gripper in the lowering of the probe.

14. The probe bonding method according to claim 8, further comprising checking whether the probe is soldered to a predetermined bonding position by photographing the end of the probe soldered to the electrode of the substrate by the fourth vision device.

15. The probe bonding device according to claim 1, wherein the forming unit includes a pair of jigs configured to hold the lower portion of the probe, one of the jigs including a first step portion therein, and wherein the second gripper includes a pair of jaws configured to hold an upper portion of the probe, one of the jaws including a second step configured to be aligned with the first step portion when the second gripper gripping the probe is moved above the forming unit.

16. The probe bonding device according to claim 15, wherein the controller is configured to align the probe by lowering the second gripper toward the forming unit while the probe is being held by both of the jigs of the forming unit and the jaws of the second gripper, until a lower end and an upper end of the probe contact the first and second steps, respectively.

17. The probe bonding device according to claim 1, wherein the dipping unit includes:
 a solder bath unit including a plurality of solder bath arranged thereon in a circumferential direction, the solder bath unit being configured to rotate on a vertical axis; and
 a syringe disposed above the solder bath unit and supplying a solder paste to a corresponding solder bath which is located below the syringe by rotating the solder bath unit.

* * * * *